United States Patent
Seckin et al.

(10) Patent No.: US 7,912,429 B2
(45) Date of Patent: Mar. 22, 2011

(54) LO 2LO UPCONVERTER FOR AN IN-PHASE/QUADRATURE-PHASE (I/Q) MODULATOR

(75) Inventors: Utku Seckin, Istanbul (TR); Rajasekhar Pullela, Tustin, CA (US); Bipul Agarwal, Irvine, CA (US)

(73) Assignee: Mediatek, Inc., Hsinchu (TW)

( * ) Notice: Subject to any disclaimer, the term of this patent is extended or adjusted under 35 U.S.C. 154(b) by 375 days.

(21) Appl. No.: 12/144,878

(22) Filed: Jun. 24, 2008

(65) Prior Publication Data

US 2009/0036069 A1 Feb. 5, 2009

Related U.S. Application Data

(63) Continuation-in-part of application No. 11/220,030, filed on Sep. 6, 2005, now Pat. No. 7,398,073.

(60) Provisional application No. 60/946,259, filed on Jun. 26, 2007.

(51) Int. Cl.
*H01Q 11/12* (2006.01)

(52) U.S. Cl. ....... 455/118; 455/168.1; 455/86; 455/146; 455/313; 455/316; 375/316; 375/317; 375/318

(58) Field of Classification Search .................. 455/118, 455/168.1, 86, 146, 313, 316; 375/316, 317, 375/318
See application file for complete search history.

(56) References Cited

U.S. PATENT DOCUMENTS

| | | | |
|---|---|---|---|
| 6,269,253 B1 | 7/2001 | Maegawa et al. | |
| 6,804,499 B2 | 10/2004 | Khosrowbeygi et al. | |
| 7,120,406 B2 * | 10/2006 | van der Burgt | 455/168.1 |
| 7,421,250 B2 * | 9/2008 | Shi | 455/73 |
| 2002/0055337 A1 | 5/2002 | Persico et al. | |
| 2003/0021237 A1 | 1/2003 | Min et al. | |
| 2003/0169089 A1 | 9/2003 | Manku et al. | |
| 2004/0077324 A1 | 4/2004 | Wieck | |
| 2007/0054648 A1 | 3/2007 | Pullela et al. | |

FOREIGN PATENT DOCUMENTS

| | | |
|---|---|---|
| JP | 2000-098023 | 4/2000 |
| JP | 2004-357025 | 12/2004 |
| WO | WO 2003/023983 | 3/2003 |
| WO | WO 2004/001997 | 12/2003 |
| WO | WO 2007-030369 | 3/2007 |

* cited by examiner

*Primary Examiner* — Sanh D Phu
(74) *Attorney, Agent, or Firm* — Thomas|Kayden

(57) ABSTRACT

An upconverter includes a switching architecture configured to receive an input signal, a first local oscillator (LO) signal, and a second local oscillator (2LO) signal that is at a frequency that is twice a frequency of the local oscillator (LO) signal, wherein the switching architecture is configured to switch the input signal on transitions of the second local oscillator (2LO) signal, and wherein the first local oscillator signal and the second local oscillator signal are combined to form combined LO 2LO switching signals.

18 Claims, 11 Drawing Sheets

US 7,912,429 B2

LO 2LO UPCONVERTER FOR AN IN-PHASE/QUADRATURE-PHASE (I/Q) MODULATOR

CROSS-REFERENCE TO RELATED APPLICATION

This application claims priority to and the benefit of the filing date of co-pending U.S. Provisional Patent Application No. 60/946,259, filed on Jun. 26, 2007, entitled "LO-2LO Upconverter In IQ Modulators for SAW-less Transmitters," the entire disclosure of which is hereby incorporated herein by reference; and is a continuation-in-part of U.S. patent application Ser. No. 11/220,030, filed on Sep. 6, 2005 now U.S. Pat. No. 7,398,073, entitled "Low Noise Mixer," the entire disclosure of which is hereby incorporated herein by reference.

BACKGROUND

Portable communication devices, such as cellular telephones, personal digital assistants (PDAs), WIFI transceivers, and other communication devices must be capable of communicating using a number of different frequency bands. For example, current portable communication devices may communicate in three, four, or more communication bands.

One of the challenges in designing a portable communication device that operates in multiple bands is providing isolation between the transmit and receive bands. For example, transmit energy in a particular transmit band must not overlap and interfere with a receive band. One way of ensuring this isolation is to implement a surface acoustic wave (SAW) filter at the output of each transmitter. A SAW filter reduces the noise of the transmitter output at the receiver frequency to prevent desensitizing the receiver. However, the SAW filter consumes valuable space on the integrated circuit and is costly to implement. Therefore, with the need for including more and more standards into a single radio frequency (RF) transceiver, eliminating the SAW filter in the transmitter design becomes highly attractive to aid in reducing cost and package size.

In order to eliminate the SAW filter from the transmit path, the noise of the transmitter should be low at the corresponding receive frequency. Unfortunately, it is not possible to reduce the noise of the transmitter to such low levels with available transmitter architectures.

In a modern RF transmitter, upconversion of baseband data is realized by multiplying, also referred to as mixing, the data signal with a carrier signal. Using the trigonometric identity, $$\cos(x)\cdot\cos(y) = \frac{1}{2}(\cos(x-y)+\cos(x+y))$$

The baseband signal is upconverted into two sidebands in the frequency domain. Since only one of the generated sidebands is of interest, the unwanted sideband is rejected by using in-phase (I or sine) and quadrature-phase (Q or cos) signals both for baseband and LO signals.

In an in-phase (I) quadrature-phase (Q) (I/Q) transmitter that relies on a 90 degree phase separation between the in-phase signal and the quadrature-phase signal, one of the most significant circuit elements that limits the achievable performance is the local oscillator (LO) signal generation circuitry in the upconverter. The LO signal can be thought of as a reference signal that is used to upconvert the baseband information signal to a transmit signal. Therefore, phase noise of the LO signal at an offset frequency away from the main frequency directly contributes to the noise of the transmitter output. Specifically, for the offset frequencies which overlap the receive frequency of a different user channel, phase noise performance becomes highly critical. Typically, the circuitry that generates the LO signal occupies a large circuit area on an integrated circuit and consumes high power in order to maintain a low phase noise.

The baseband signal and the LO signal are combined in what is referred to as a "mixer core." The mixer core is another critical element in the transmit chain. Similar to the circuitry that generates the LO signal, the mixer core also generates noise which directly contributes to noise in the transmitter output. An active mixer typically consumes high power in order to keep noise low. A passive mixer does not consume power, but provides limited isolation between I and Q baseband inputs. Good isolation between the I and Q baseband inputs is vital for most transmitters.

Therefore, it would be desirable to have an upconverter that achieves low phase noise, provides good sideband isolation and that consumes minimal circuit area and power.

SUMMARY

Embodiments of an upconverter include a switching architecture configured to receive an input signal, a first local oscillator (LO) signal, and a second local oscillator (2LO) signal that is at a frequency that is twice a frequency of the local oscillator (LO) signal, wherein the switching architecture is configured to switch the input signal on transitions of the second local oscillator (2LO) signal, and wherein the first local oscillator signal and the second local oscillator signal are combined to form combined LO 2LO switching signals.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
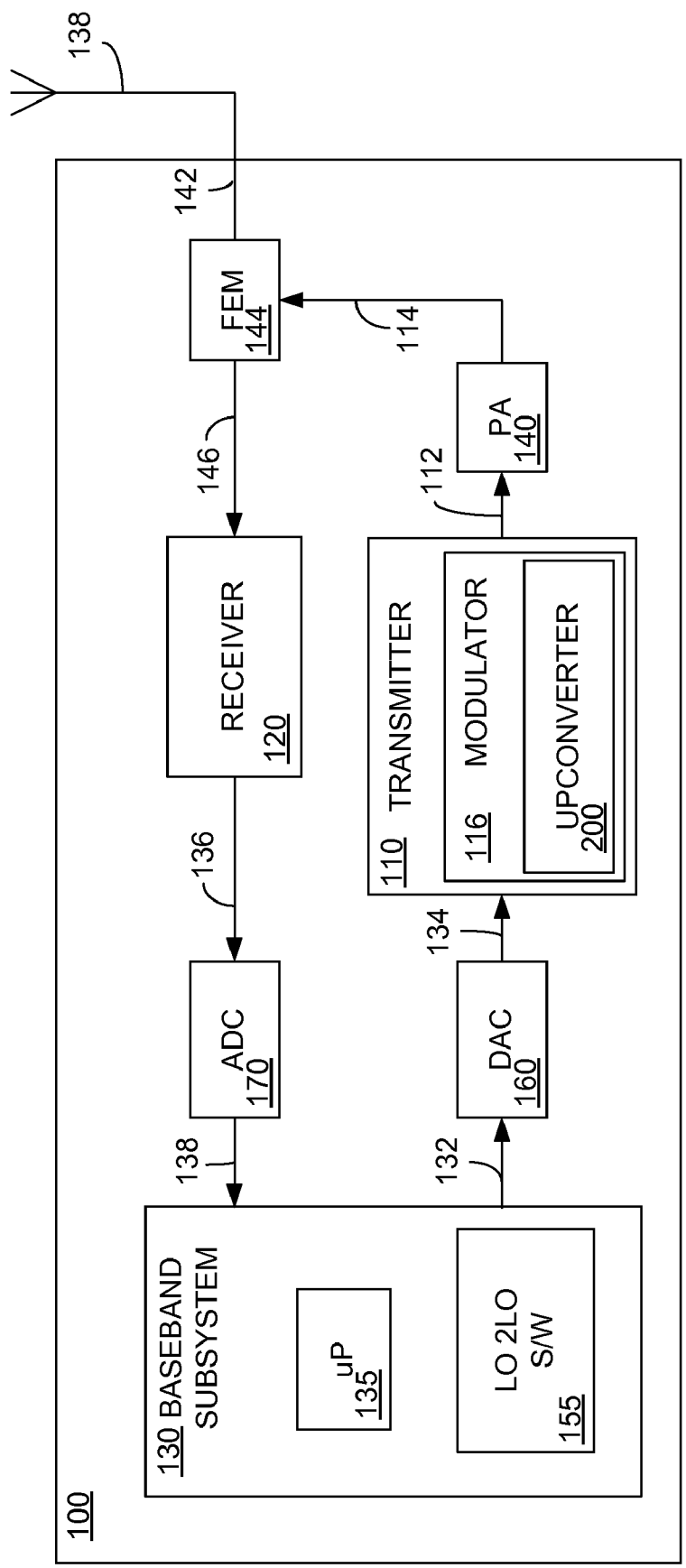
FIG. 1 is a block diagram illustrating a simplified portable transceiver.

Although described with particular reference to a portable transceiver, the LO 2LO upconverter for an I/Q modulator can be used in any device that uses signal upconversion in a transmitter. The LO 2LO upconverter for an I/Q modulator can be implemented in a passive mixer, or can be implemented in an active mixer. Further, the LO 2LO upconverter for an I/Q modulator can be implemented in the mixer core, or can be implemented in the LO generation circuitry with a conventional mixer core.

A passive mixer offers low power consumption, low noise and high linearity, but requires better performance from the following stages. The most problematic drawback of a passive mixer is the lack of isolation between I and Q inputs. This lack of isolation significantly reduces the sideband rejection, and limits the effective use of a passive mixer in many applications. An active mixer provides gain, and hence, reduces the noise contribution of the following stages to the overall system noise. However, an active mixer tends to consume a significant amount of current to achieve good noise and linearity performance.

The generation of quadrature I and Q LO signals is also important to mixer operation. Since both phase noise and I and Q matching of the quadrature LO signals are important, the circuitry related to the generation of the LO signal typically consumes high power and occupies a large area on the circuit.

The LO 2LO upconverter for an I/Q modulator overcomes most of the challenges described above. The LO 2LO upconverter for an I/Q modulator significantly reduces the contribution of LO chain phase noise to the overall system noise. The LO 2LO upconverter for an I/Q modulator also reduces the effect of IQ imbalance in the LO chain that degrades the sideband rejection of the upconverter.

Further, by improving the isolation between the I and Q inputs for a passive mixer, the LO 2LO upconverter for an I/Q modulator allows the use of a passive mixer in numerous applications without degrading sideband rejection performance.

The LO 2LO upconverter for an I/Q modulator can be implemented in hardware, software, or a combination of hardware and software. When implemented in hardware, the LO 2LO upconverter for an I/Q modulator can be implemented using specialized hardware elements and logic. When the LO 2LO upconverter for an I/Q modulator is implemented partially in software, the software portion can be used to precisely control the various components when generating the LO and 2LO signals. The software can be stored in a memory and executed by a suitable instruction execution system (microprocessor). The hardware implementation of the LO 2LO upconverter for an I/Q modulator can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the LO 2LO upconverter for an I/Q modulator comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100. Embodiments of the LO 2LO upconverter for an I/Q modulator can be implemented in any RF transmitter or RF transceiver, and in this example, are implemented in an RF transmitter associated with a portable transceiver 100. The portable transceiver 100 illustrated in FIG. 1 is intended to be a simplified example and to illustrate one of many possible applications in which the LO 2LO upconverter for an I/Q modulator can be implemented. One having ordinary skill in the art will understand the operation of a portable transceiver. The portable transceiver 100 includes a transmitter 110, a receiver 120, a baseband subsystem 130, a digital-to-analog converter (DAC) 160 and an analog-to-digital converter (ADC) 170. The transmitter includes a modulator 116 and an upconverter 200. In an embodiment, the upconverter 200 can be a subsystem of the modulator 116. In alternative embodiments, the upconverter 200 can be a separate circuit block or circuit element. The upconverter 200 implements embodiments of the LO 2LO upconverter for an I/Q modulator as described herein.

The transmitter also includes any other functional elements that modulate and upconvert a baseband signal. The receiver 120 includes filter circuitry and downconverter circuitry that enable the recovery of the information signal from the received RF signal. The portable transceiver 100 also includes a power amplifier 140. The output of the transmitter 110 is provided over connection 112 to the power amplifier 140. Depending on the communication methodology, the portable transceiver may also include a power amplifier control element (not shown).

The receiver 120 and the power amplifier 140 are connected to a front end module 144. The front end module 144 can be a duplexer, a diplexer, or any element that separates the transmit signal from the receive signal. The front end module 144 is connected to an antenna 138 over connection 142.

In transmit mode, the output of the power amplifier 140 is provided to the front end module 144 over connection 114. In receive mode, the front end module 144 provides a receive signal to the receiver 120 over connection 146.

If portions of the LO 2LO upconverter for an I/Q modulator are implemented in software, then the baseband subsystem 130 also includes LO 2LO upconverter software 155 that can be executed by a microprocessor 135, or by another processor, to control the operation of the LO 2LO upconverter for an I/Q modulator to be described below.

When transmitting, the baseband transmit signal is provided from the baseband subsystem 130 over connection 132 to the DAC 160. The DAC 160 converts the digital baseband transmit signal to an analog signal that is supplied to the transmitter 110 over connection 134. The modulator 116 and the upconverter 200 modulate and upconvert the analog transmit signal according to the modulation format prescribed by the system in which the portable transceiver 100 is operating. The modulated and upconverted transmit signal is then supplied to the power amplifier 140 over connection 112.

When receiving, the filtered and downconverted receive signal is supplied from the receiver 120 to the ADC 170 over connection 136. The ADC digitizes the analog receive signal and provides the analog baseband receive signal to the baseband subsystem 130 over connection 138. The baseband subsystem 130 recovers the transmitted information.

Figure 2:
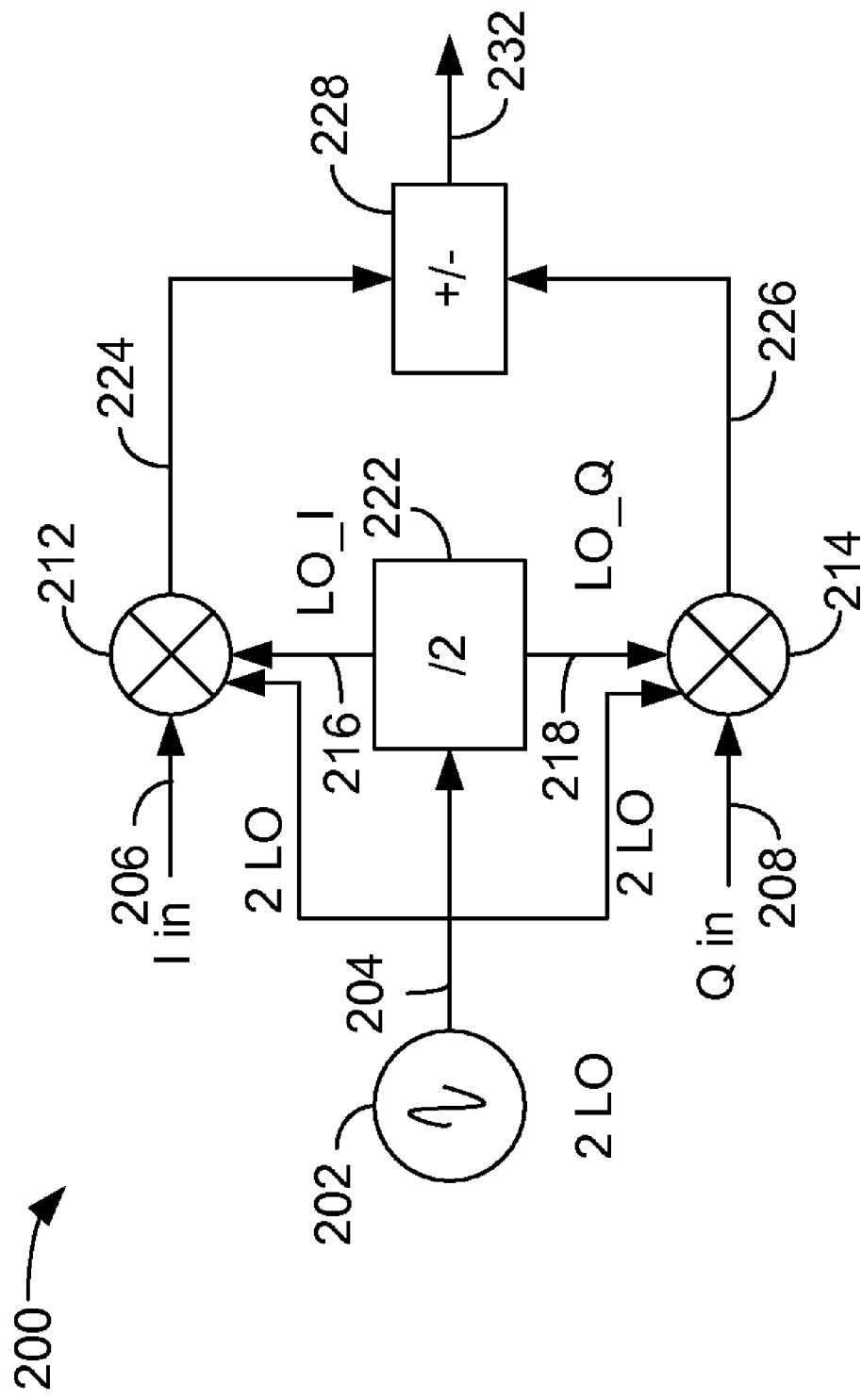
FIG. 2 is a simplified schematic diagram illustrating an embodiment of an LO 2LO upconverter for an I/Q modulator.

FIG. 2 is a simplified schematic diagram illustrating an embodiment of an LO 2LO upconverter for an I/Q modulator. The upconverter 200 includes an oscillator 202 configured to generate an LO signal on connection 204 that is twice the frequency of the desired LO signal. For example, if the desired LO frequency is a nominal 100 MHz, the signal on connection 204 is nominally 200 MHz. The upconverter 200 also includes a mixer core 212 and a mixer core 214. The mixer cores 212 and 214 are arranged to operate on the quadrature signals I and Q. In an example, the in-phase signal, I_in, is supplied over connection 206 to the mixer core 212 and the quadrature-phase input signal, Q_in, is supplied over connection 208 to the mixer core 214.

The 2LO signal on connection 204 is supplied to the mixer cores 212 and 214, and is also supplied to a divider 222. In an embodiment, the divider 222 is a quadrature divider. The divider 222 divides the 2LO signal on connection 204 to a nominal value of LO on connections 216 and 218. In this example, an LO_I signal is supplied to the mixer core 212 over connection 216 and an LO_Q signal is supplied to the mixer core 214 over connection 218.

As will be described in greater detail below, the mixer cores 212 and 214 each receive the LO signal and the 2LO signal. The mixer core 212 upconverts the I_in signal and the mixer core 214 upconverts the Q_in signal with minimal noise and impairments. The upconverted I_in signal is supplied to a combining element 228 over connection 224 and the upconverted Q_in signal is supplied to the combining element 228 over connection 226. The output of the combining element 228 on connection 232 is the output signal that is supplied to the power amplifier 140 (FIG. 1). Either the in-phase signal or the quadrature-phase signal can be chosen either by changing the final combining element operation to addition (or subtraction), or by interchanging the I and Q LO signals without changing the final operation.

The architecture of the upconverter 200 suppresses the noise contribution of the frequency divider that is used to generate the quadrature LO signals, LO_I and LO_Q, and therefore, minimizes transmitter noise and sideband generation. Further, as will be described below, the architecture of the upconverter 200 provides a high level of input isolation between the I and Q inputs for a passive mixer implementation.

Figures 3A, 3B:
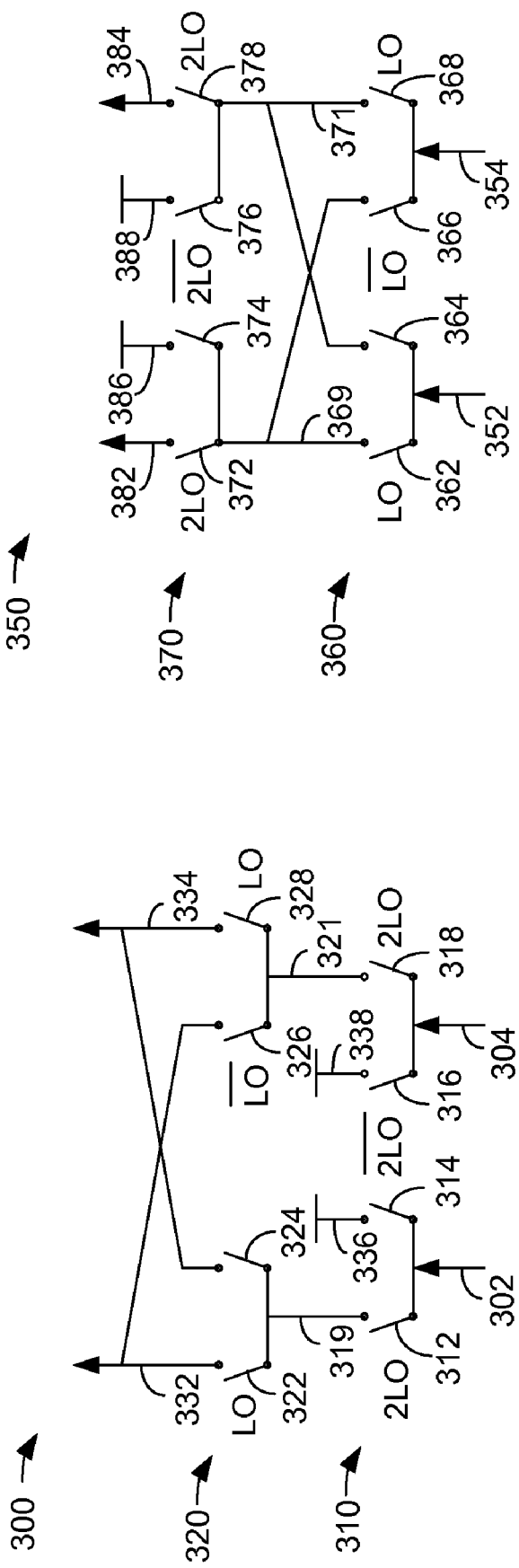
FIG. 3A is a schematic diagram illustrating an embodiment of the LO 2LO upconverter implemented in an active mixer arrangement.
FIG. 3B is a schematic diagram illustrating an embodiment of the LO 2LO upconverter implemented in a passive mixer arrangement.

FIG. 3A is a schematic diagram illustrating an embodiment of the LO 2LO upconverter implemented in an active mixer architecture. A mixer core 300 is configured to receive a differential input signal over connections 302 and 304. For simplicity, only one of the two quadrature phases is shown in FIG. 3A. Either the in-phase (I) signal or the quadrature-phase (Q) signal is supplied to the mixer core 300.

The mixer core 300 includes a set of switches 310 and a set of switches 320. The set of switches 310 includes switches 312, 314, 316 and 318. The switches 312, 314, 316 and 318 are illustrated as simple single-pole, single-throw switches to illustrate that any type of switch can be used. For example, any type of semiconductor switch, such as a bipolar junction transistor (BJT), a field effect transistor (FET), any variants thereof, or any other switch architecture can be implemented in the description to follow.

The set of switches 310 are configured to receive the 2LO signal. For example, a differential input signal supplied over connection 302 is supplied to the switches 312 and 314. The switch 312 receives the 2LO signal while the switch 314 receives the inverse of the 2LO signal, also referred to as $\overline{2LO}$, or 2LO bar. The switches 316 and 318 receive the opposite differential signal over connection 304. The switch 316 receives the $\overline{2LO}$ signal and the switch 318 receives the 2LO signal.

The set of switches 320 includes switches 322, 324, 326 and 328. The set of switches 320 are configured to receive the LO signal. The switch 322 receives the LO signal, the switches 324 and 326 receive the inverse of the LO signal, also referred to as $\overline{LO}$, or LO bar, and the switch 328 receives the LO signal.

The output of the switch 312 is supplied via connection 319 to the switches 322 and 324. The output of the switch 318 is supplied via connection 321 to the switches 326 and 328. The output of the switch 314 is provided to terminal 336 and the output of switch 316 is provided to terminal 338. The output of switches 314 and 316 is discarded when the switches 314 and 316 are active. The output of the mixer core 300 is taken over connection 332 and 334.

The mixer core 300 includes two levels of switches, 310 and 320 as shown above, i.e., LO and 2LO levels. In an active mixer, such as shown in FIG. 3A, if low-flicker noise is desired the 2LO switches 312, 314, 316 and 318 level should be located before the LO switches 322, 324, 326 and 328.

FIG. 3B is a schematic diagram illustrating an embodiment of the LO 2LO upconverter implemented in a passive mixer arrangement. A mixer core 350 is configured to receive a differential input signal over connections 352 and 354. For simplicity, only one of the two phases is shown in FIG. 3B. Either the in-phase signal or the quadrature-phase signal will be supplied to the mixer core 350.

The mixer core 350 includes a set of switches 360 and a set of switches 370. The set of switches 360 includes switches 362, 364, 366 and 368. The set of switches 360 are configured to receive the LO signal. For example, a differential input signal supplied over connection 352 is supplied to the switches 362 and 364. The switch 362 receives the LO signal while the switch 364 receives the inverse of the LO signal, also referred to as $\overline{LO}$, or LO bar. The switches 366 and 368 receive the opposite differential signal over connection 354. The switch 366 receives the $\overline{LO}$ signal and the switch 368 receives the LO signal.

The set of switches 370 includes switches 372, 374, 376 and 378. The set of switches 370 are configured to receive the 2LO signal. The switch 372 receives the 2LO signal, the switches 374 and 376 receive the inverse of the 2LO signal, also referred to as $\overline{2LO}$, or 2LO bar, and the switch 378 receives the 2LO signal.

The output of the switch 362 is supplied via connection 369 to the switches 372 and 374. The output of the switch 368 is supplied via connection 371 to the switches 376 and 378. The output of the switch 364 is supplied to connection 371 and the output of the switch 366 is supplied to connection 369. The output of the mixer core 350 is taken over connection 382 and 384. The output of the switch 374 is provided to terminal 386 and the output of switch 376 is provided to terminal 388. The output of switches 374 and 376 is discarded when the switches 374 and 376 are active.

The mixer core 350 includes two levels of switches, 360 and 370 as shown above, i.e., LO and 2LO levels. In a passive mixer, such as shown in FIG. 3B, the LO switches 362, 364, 366 and 368 can be located either before or after the 2LO switches 372, 374, 376 and 378. In an embodiment, the LO switches 362, 364, 366 and 368 are located before the 2LO switches 372, 374, 376 and 378.

Both of the embodiments shown in FIGS. 3A and 3B include an additional level of switches which are driven by 2 times the LO frequency, 2LO. The signal 2LO is readily available if I and Q phases of the LO signal are generated by using a frequency divider, such as the divider 222 of FIG. 2, which is a common way of I and Q LO signal generation. Alternatively, other ways of generating the 2LO signal as possible.

Figure 4:
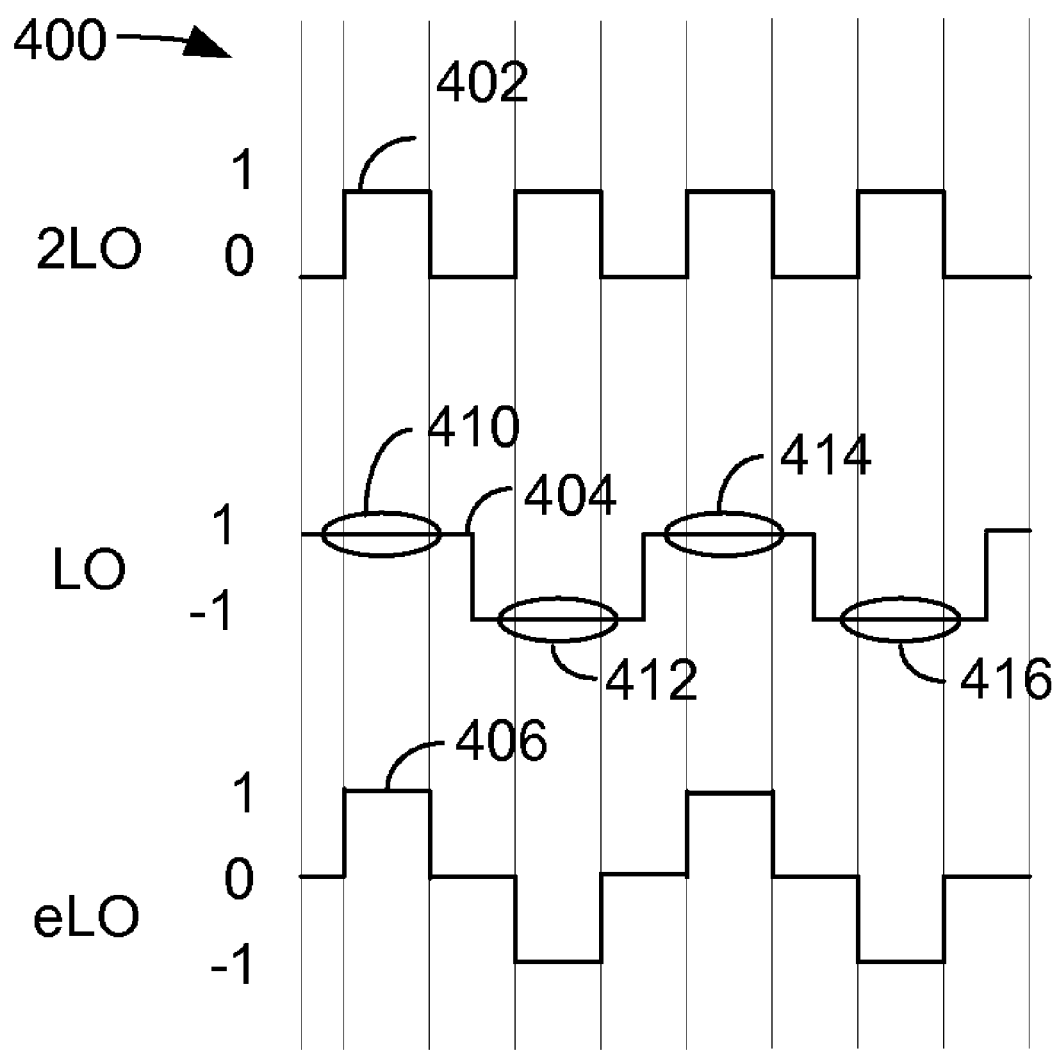
FIG. 4 is a graphical illustration of the LO and 2LO signals used in the mixer cores of FIGS. 3A and 3B.

FIG. 4 is a graphical illustration of the LO and 2LO signals used in the mixer cores of FIGS. 3A and 3B. The diagram 400 includes a signal trace 402 that represents the 2LO signal, a signal trace 404 that represents the LO signal, and a signal trace 406 that represents the effective LO (eLO) signal. The positive and negative cycles of the LO signal 404 are associated with "1" and "−1" respectively, which is a direct result of the switch arrangement. However, the positive and negative cycles of the 2LO signal 402 are associated with "1" and "0" since on the negative cycle the input signal is discarded. Discarding half of the signal, and hence, half of the noise, improves the noise performance of the upconverter due to second-order effects. The effective LO signal 406 illustrates the switching of the mixer core (300 or 350) only when the 2LO signal 402 switches. In this manner, the LO signal 404 is always settled and stable and is not at a switching transition when the 2LO switches are active. This is illustrated in FIG. 4 at 410, 412, 414 and 416. In this manner, the arrangement of the LO and 2LO phases allows the mixer core to achieve optimum performance. In order to suppress any non-ideality in the LO signals, such as phase noise or imbalance between the I and Q signals, the switching instant of the LO signal 404 occurs during a "0" cycle of the 2LO signal 402. As shown in FIG. 4, this ensures that the effective LO signal 406 does not depend on the transitions of the LO signal, but only depends on the transitions of the 2LO signal 402.

Figure 5:
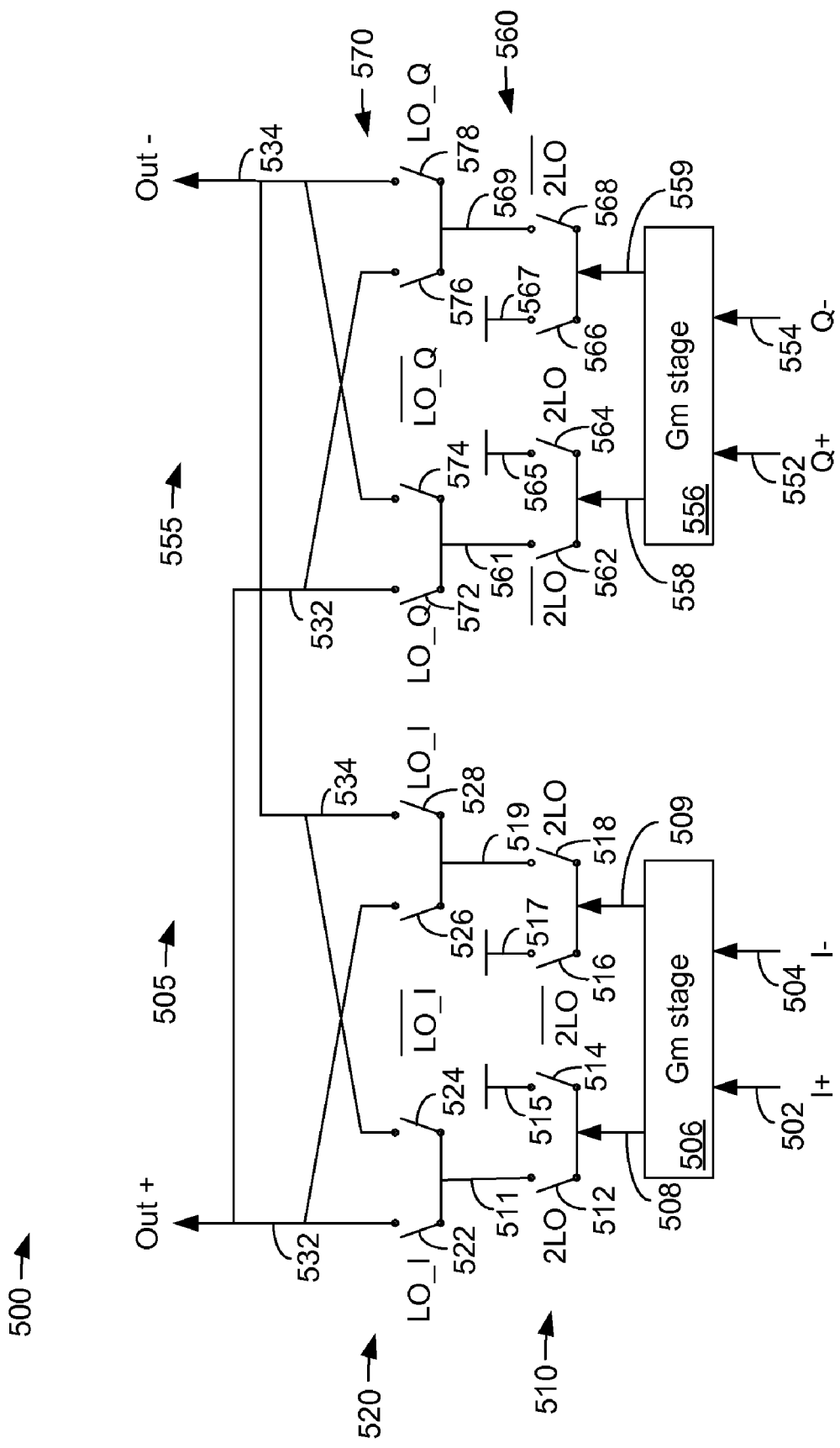
FIG. 5 is a schematic diagram illustrating a differential active mixer core constructed in accordance with an embodiment of the LO 2LO upconverter.

FIG. 5 is a schematic diagram illustrating a differential active mixer core constructed in accordance with an embodiment of the LO 2LO upconverter. The mixer core 500 includes an in-phase mixer core 505 and a quadrature-phase mixer core 555. The in-phase mixer core 505 receives differential in-phase (I) input signals over connections 502 and 504. The signals on connections 502 and 504 are supplied to a transconductance amplifier, also referred to as a Gm stage, 506. The output of the Gm stage 506 is supplied over connections 508 and 509.

The in-phase mixer core 505 includes a first set of switches 510 and a second set of switches 520. The first set of switches 510 is configured to receive the 2LO signal and the second set of switches 520 is configured to receive the LO signal.

The first set of switches 510 includes switches 512, 514, 516 and 518. The output of the Gm stage 506 on connection 508 is supplied to the switches 512 and 514. The output of the Gm stage 506 on connection 509 is supplied to the switches 516 and 518. The 2LO signal controls the switch 512, the $\overline{2LO}$ signal controls the switches 514 and 516, and the 2LO signal controls to switch 518.

The second set of switches 520 includes switches 522, 524, 526 and 528. The second set of switches 520 is configured to receive the LO signal. The switch 522 is controlled by the in-phase LO input signal, LO_I, the switches 524 and 526 are controlled by the opposite in-phase LO input signal, $\overline{LO\_I}$ signal and the switch 528 is controlled by the LO_I signal. The output of the switch 512 is supplied via connection 511 to the switches 522 and 524. The output of the switch 518 is supplied via connection 519 to the switches 526 and 528. The output of the switch 522 is supplied over connection 532, the output of the switch 524 is supplied over connection 534, the output of switch 526 is supplied over connection 532 and the output of the switch 528 is supplied over connection 534. The output of the switch 514 is provided to terminal 515 and the output of switch 516 is provided to terminal 517. The output of switches 514 and 516 is discarded when the switches 514 and 516 are active.

The quadrature-phase mixer core 555 receives differential quadrature-phase (Q) input signals over connections 552 and 554. The signals on connections 552 and 554 are supplied to a transconductance amplifier, also referred to as a Gm stage, 556. The output of the Gm stage 556 is supplied over connections 558 and 559.

The quadrature-phase mixer core 555 includes a first set of switches 560 and a second set of switches 570. The first set of switches 560 is configured to receive the 2LO signal and the second set of switches 570 is configured to receive the LO signal.

The first set of switches 560 includes switches 562, 564, 566 and 568. The output of the Gm stage 556 on connection 558 is supplied to the switches 562 and 564. The output of the Gm stage 556 on connection 559 is supplied to the switches 566 and 568. The $\overline{2LO}$ signal controls the switch 562, the 2LO signal controls the switches 564 and 566, and the $\overline{2LO}$ signal controls to switch 568.

The second set of switches 570 includes switches 572, 574, 576 and 578. The second set of switches 570 is configured to receive the LO signal. The switch 572 is controlled by the quadrature-phase LO input signal, LO_Q, the switches 574 and 576 are controlled by the opposite quadrature-phase LO input signal, $\overline{LO\_Q}$ and the switch 578 is controlled by the LO_Q signal. The output of the switch 562 is supplied via connection 561 to the switches 572 and 574. The output of the switch 568 is supplied via connection 569 to the switches 576 and 578. The output of the switch 572 is supplied over connection 532, the output of the switch 574 is supplied over connection 534, the output of switch 576 is supplied over connection 532 and the output of the switch 578 is supplied over connection 534. The output of the switch 564 is provided to terminal 565 and the output of switch 566 is provided to terminal 567. The output of switches 564 and 566 is discarded when the switches 564 and 566 are active. The output of the mixer core 500 is taken over connections 532 and 534.

In the configuration shown in FIG. 5, the I and Q inputs, shown as I+, I−, Q+ and Q−; I and Q LO signals, shown as LO_I and LO_Q, and the polarity of the output connections can be interchanged. The resulting upconverter will provide the benefits described above, regardless of whether the lower frequency sideband or higher frequency sideband is selected.

As described above with respect to FIG. 4, the switching instants are arranged appropriately such that the upper-level switches (520 and 570) switch while the current input generated by the corresponding Gm stage is being discarded by the lower-level switches (510 and 560).

The use of the LO 2LO upconverter architecture with an active mixer improves the noise performance by suppressing the noise of the LO generation circuitry and reducing flicker noise during signal upconversion. The LO 2LO upconverter architecture also improves sideband rejection since sideband rejection depends on the positive and negative edges of the 2LO signal, rather than the phase matching of the LO_I and LO_Q signals. Given these advantages, significant current reduction and area reduction are possible.

Figure 6:
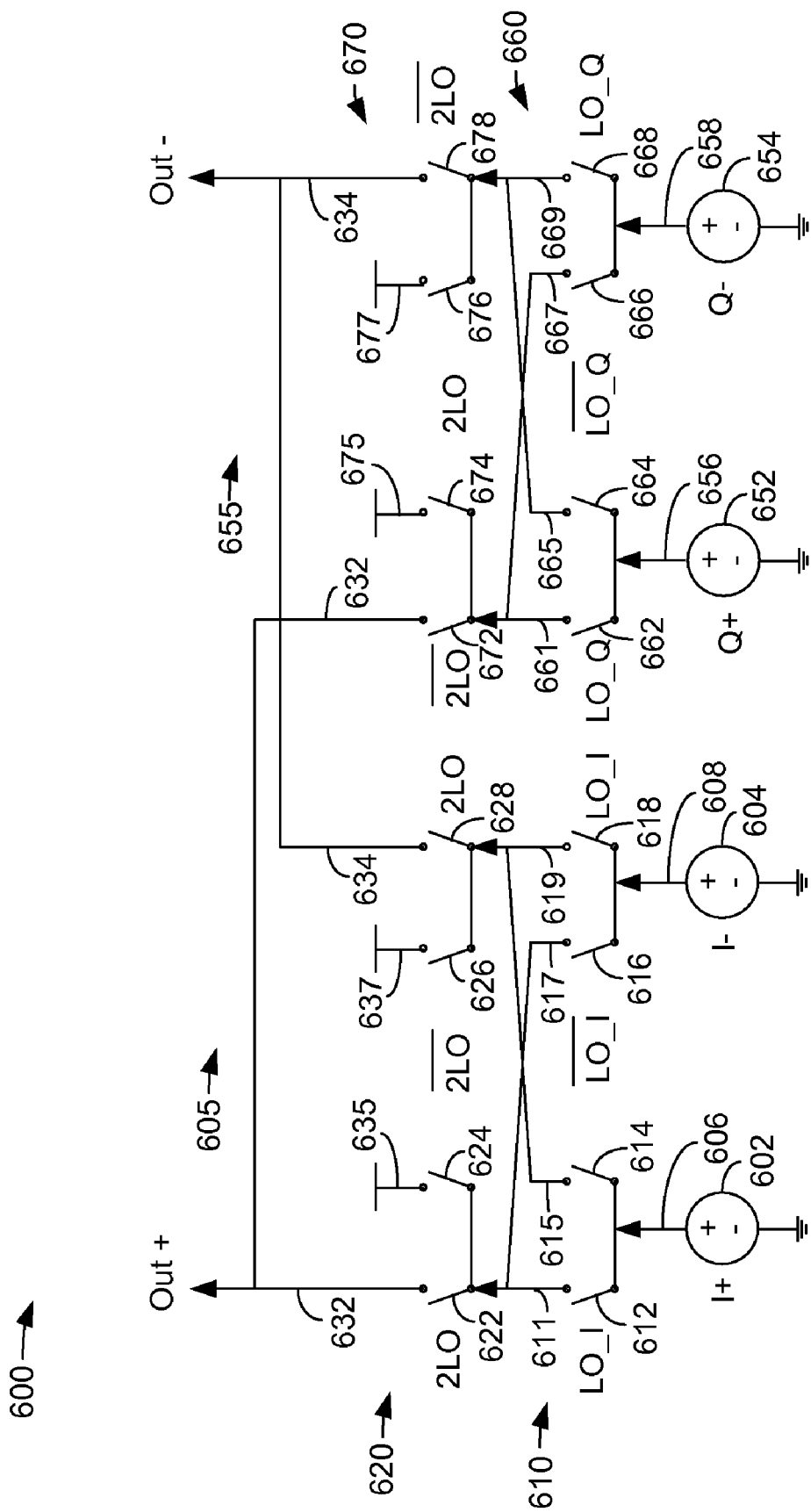
FIG. 6 is a schematic diagram illustrating a differential passive mixer core constructed in accordance with an embodiment of the LO 2LO upconverter.

FIG. 6 is a schematic diagram illustrating a differential passive mixer core constructed in accordance with an embodiment of the LO 2LO upconverter. The mixer core 600 includes an in-phase mixer core 605 and a quadrature-phase mixer core 655. The in-phase mixer core 605 receives differential in-phase (I) input signals from voltage sources 602 and 604.

The in-phase mixer core 605 includes a first set of switches and 610 and a second set of switches 620. The first set of switches 610 is controlled by the in-phase LO signal and the second set of switches 620 is controlled by the 2LO signal.

The first set of switches 610 includes switches 612 and 614, 616 and 618. The output of the current source 602 on connection 606 is supplied to the switches 612 and 614. The output of the voltage source 604 on connection 608 is supplied to the switches 616 and 618.

The switch 612 is controlled by the in-phase LO signal, LO_I, the switches 614 and 616 are controlled by the opposite in-phase signal, $\overline{LO\_I}$, and the switch 618 is controlled by the in-phase LO signal, LO_I.

The output of the switch 612 is supplied over connection 611 to the switch 622. The output of the switch 614 is supplied over connection 615, the output of the switch 616 is supplied over connection 617, and the output of the switch 618 is supplied over connection 619 to the switch 628.

The switch 622 is controlled by the 2LO signal, the switches 624 and 626 are controlled by the $\overline{2LO}$ signal, and the switch 628 is controlled by the 2LO signal. The output of the switch 622 is supplied over connection 632, the output of the switch 628 is supplied over connection 634. The output of the switch 624 is provided to terminal 635 and the output of switch 626 is provided to terminal 637. The output of switches 624 and 626 is discarded when the switches 624 and 626 are active.

The quadrature-phase mixer core 655 receives differential quadrature-phase (Q) input signals from voltage sources 652 and 654. The quadrature-phase mixer core 655 includes a first set of switches 660 and a second set of switches 670. The first set of switches 660 is controlled by the quadrature-phase LO signal and the second set of switches 670 is controlled by the 2LO signal.

The first set of switches 660 includes switches 662 and 664, 666 and 668. The output of the voltage source 652 on connection 656 is supplied to the switches 662 and 664. The output of the voltage source 654 on connection 658 is supplied to the switches 666 and 668.

The switch 662 is controlled by the quadrature-phase LO signal, LO_Q, the switches 664 and 666 are controlled by the opposite quadrature-phase signal, $\overline{LO\_Q}$, and the switch 668 is controlled by the quadrature-phase LO signal, LO_Q.

The output of the switch 662 is supplied over connection 661 to the switch 672. The output of the switch 664 is supplied over connection 665, the output of the switch 666 is supplied over connection 667, and the output of the switch 668 is supplied over connection 669 to the switch 678.

The switch 672 is controlled by the $\overline{2LO}$ signal, the switches 674 and 676 are controlled by the 2LO signal, and the switch 678 is controlled by the $\overline{2LO}$ signal. The output of the switch 672 is supplied over connection 632, the output of the switch 678 is supplied over connection 634. The output of the switch 674 is provided to terminal 675 and the output of switch 676 is provided to terminal 677. The output of switches 674 and 675 is discarded when the switches 674 and 675 are active. The output of the mixer core 600 is taken over connections 632 and 634.

In the configuration shown in FIG. 6, the I and Q inputs, shown as I+, I−, Q+ and Q−; I and Q LO signals, shown as LO_I and LO_Q, and the polarity of the output connections can be interchanged. The resulting upconverter provides the benefits described above, regardless of whether the lower frequency sideband or higher frequency sideband is selected.

As described above with respect to FIG. 4, the switching instants are arranged appropriately such that the lower-level switches (610 and 660) switch while the corresponding voltage input upconverted by the lower-level switches (610 and 660) is being discarded by the upper-level switches (620 and 670).

The use of the LO 2LO upconverter architecture described herein with a passive mixer improves the noise performance by suppressing the noise of the LO generation circuitry. The LO 2LO upconverter architecture also improves sideband rejection since sideband rejection depends on the positive and negative edges of 2LO rather than the phase matching of LO_I and LO_Q. Given these advantages, significant current reduction and area reduction are possible.

Another important benefit provided by the LO 2LO upconverter architecture is to reduce the loading effect of the I and Q inputs with respect to each other. In a conventional passive mixer, the I and Q inputs are constantly loading each other, which results in significant performance degredation. However, using the LO 2LO upconverter architecture, the switches that operate on the 2LO signal provide isolation between the I and the Q inputs. However, this effect can also be minimized if current-mode input is chosen while keeping the switches in passive mode.

Figure 7:
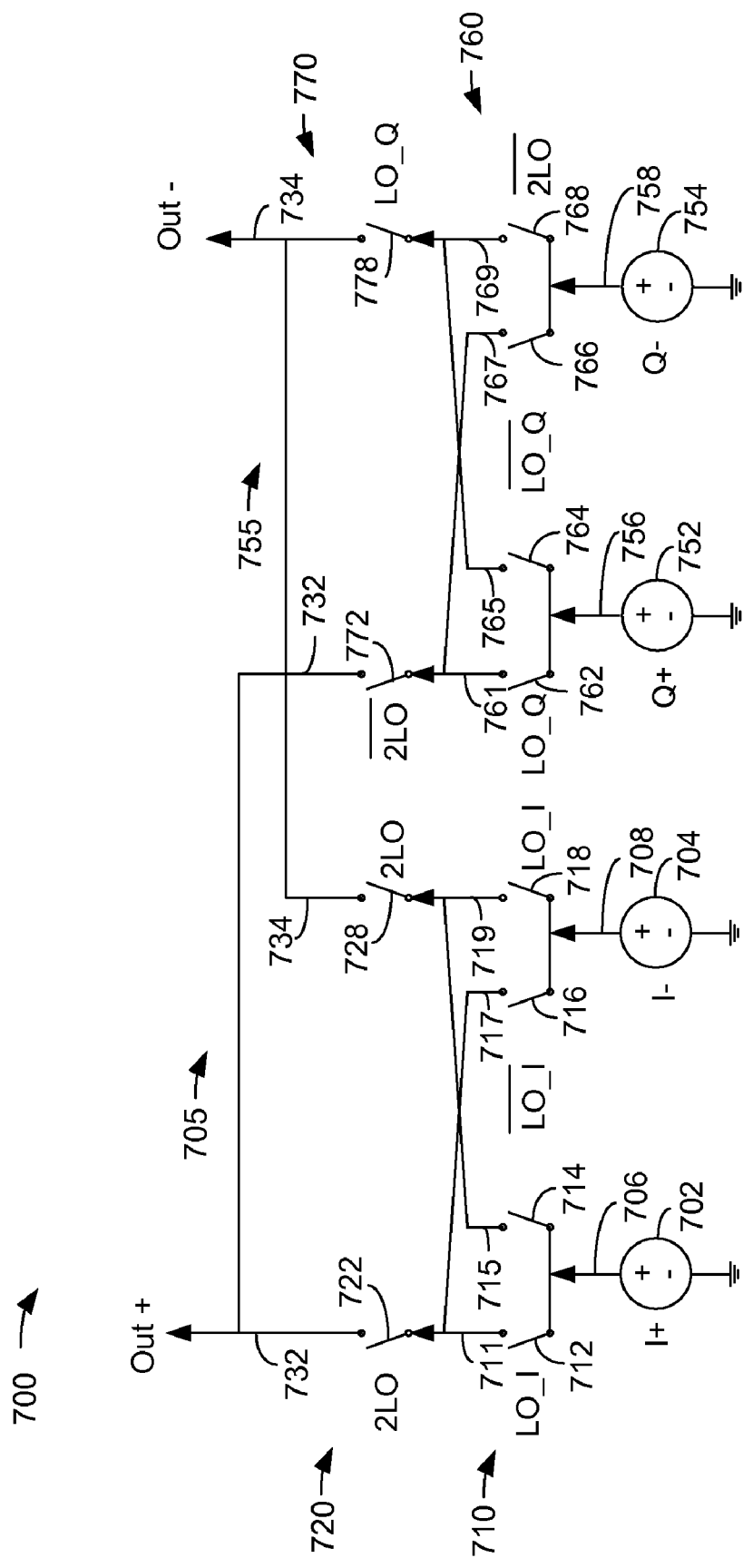
FIG. 7 is a schematic diagram illustrating an alternative embodiment of a differential passive mixer core constructed in accordance with an embodiment of the LO 2LO upconverter.

FIG. 7 is a schematic diagram illustrating an alternative embodiment of a differential passive mixer core constructed in accordance with an embodiment of the LO 2LO upconverter. The elements in FIG. 7 that are identical to the elements in FIG. 6 are labeled 7XX, where XX refers to the corresponding element in FIG. 6. If voltage-mode operation is chosen, the 2LO switch that is used to discard the input signal can be removed as shown in FIG. 7. As shown by comparing FIG. 6 to FIG. 7, the switches 624, 626, 674 and 676 are omitted.

Figure 8:
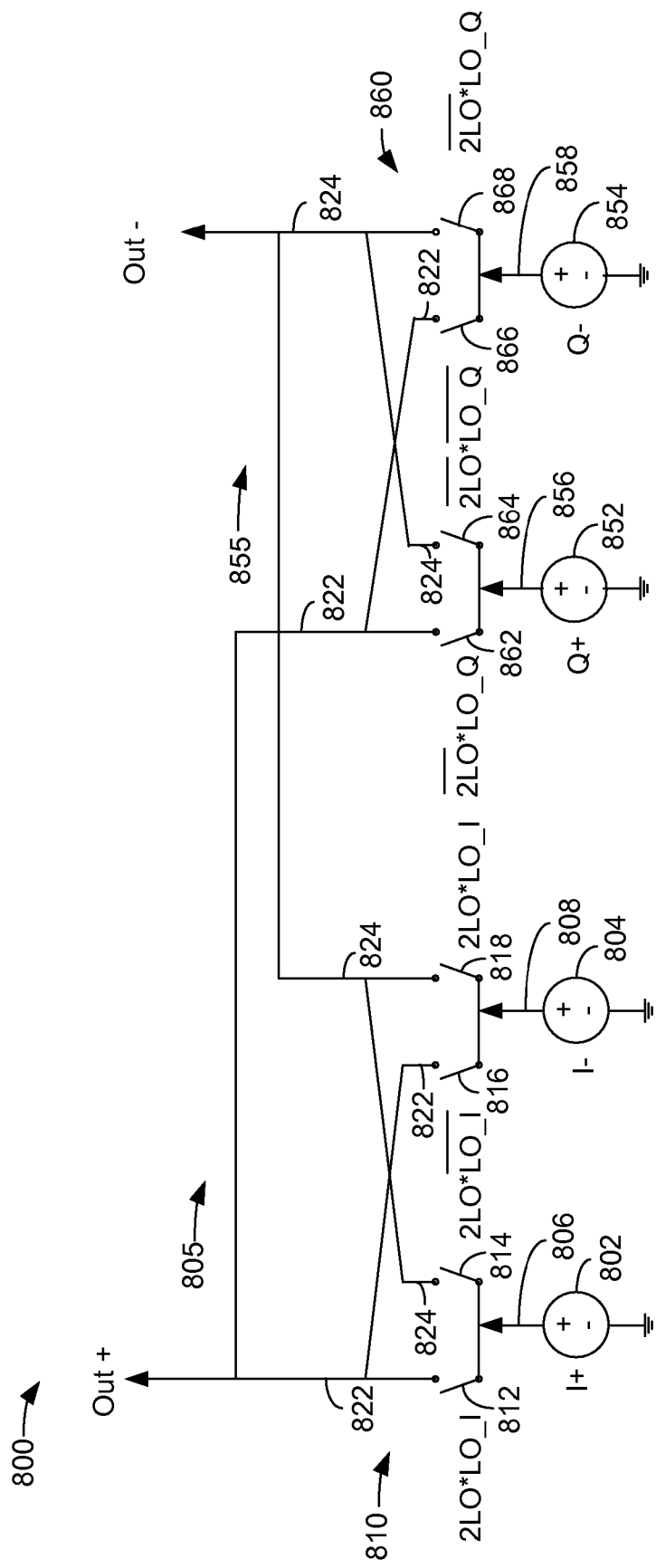
FIG. 8 is a schematic diagram illustrating another alternative embodiment of a differential passive mixer core constructed in accordance with an embodiment of the LO 2LO upconverter.

FIG. 8 is a schematic diagram illustrating another alternative embodiment of a differential passive mixer core constructed in accordance with an embodiment of the LO 2LO upconverter.

The embodiments of the above-described LO 2LO upconverter can be implemented in an alternative manner that reduces the number of switches, so that a conventional mixer architecture can be used. In this embodiment appropriate logic operations are performed with the LO and 2LO signals and the resulting waveforms are used to drive conventional I and Q upconverter mixers.

In FIG. 8, the mixer core 800 includes an in-phase mixer core 805 and a quadrature-phase mixer core 855. The in-phase mixer core 805 includes voltage sources 802 and 804, which provide differential in-phase (I) input signals. The in-phase mixer core 805 includes switches 812, 814, 816 and 818. The output of the voltage source 802 over connection 806 is provided to switches 812 and 814. The output of the voltage source 814 is provided over connection 808 to the switches 816 and 818.

In this embodiment, the switch 812 is controlled by the LO signal, 2LO*LO_I, the switches 814 and 816 are controlled by the LO signal 2LO*$\overline{\text{LO\_I}}$, and the switch 818 is controlled by the LO signal, $\overline{\text{2LO}}$*LO_I.

The output of the switch 812 is supplied over connection 822, the output of the switch 814 is supplied over connection 824, the output of the switch 816 is supplied over connection 822 and the output of the switch 818 is supplied over connection 824.

The quadrature-phase mixer core 855 includes voltage sources 852 and 854, which provide differential quadrature-phase (Q) input signals. The quadrature-phase mixer core 855 includes switches 862, 864, 866 and 868. The output of the voltage source 852 over connection 856 is provided to switches 862 and 864. The output of the voltage source 854 is provided over connection on 858 to the switches 866 and 868.

In this embodiment, the switch 862 is controlled by the LO signal, $\overline{\text{2LO}}$*LO_Q, the switches 864 and 866 are controlled by the LO signal, $\overline{\text{2LO}}$*$\overline{\text{LO\_Q}}$ and the switch 868 is controlled by the LO signal, $\overline{\text{2LO}}$*LO_Q.

The output of the switch 862 is supplied over connection 822, the output of the switch 864 is supplied over connection 824, the output of the switch 866 is supplied over connection 822 and the output of the switch 868 is supplied over connection 824. The output of the mixer core 800 is taken over connections 822 and 824.

Figure 9:
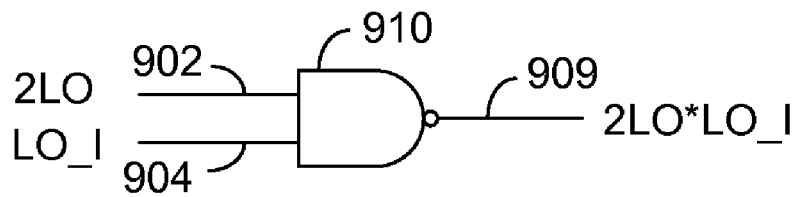
FIG. 9 is a schematic diagram illustrating an example of circuitry that can generate the LO signals described herein.
Figure 9:
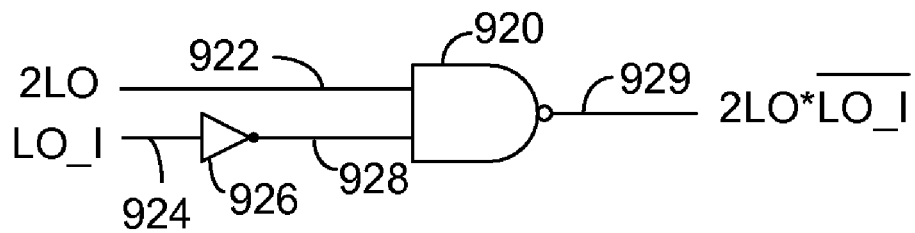
Figure 9:
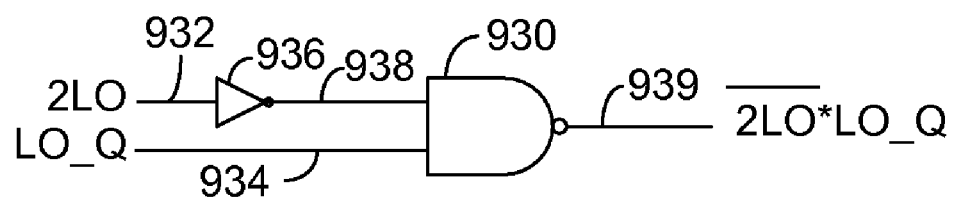
Figure 9:
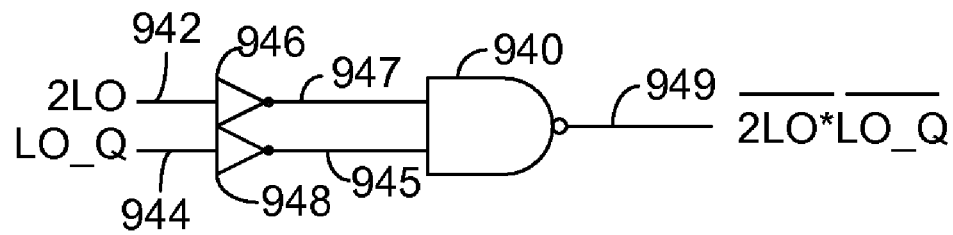

FIG. 9 is a schematic diagram illustrating an example of circuitry that can generate the LO signals described herein. Other circuit architectures can be used to generate the LO signals as described herein. The circuitry includes NAND gates 910, 920, 930 and 940. The NAND gate 910 receives the 2LO signal over input connection 902 and receives the LO_I signal over input connection 904. The 2LO*LO_I signal is generated on connection 909 by operation of the NAND gate 910.

The NAND gate 920 receives the 2LO signal over input connection 922. The LO_I signal is supplied over connection 904 to an inverter 926. The output of the inverter 926 on input connection 928 is the $\overline{\text{LO\_I}}$ signal. The 2LO*$\overline{\text{LO\_I}}$ signal is generated on connection 929 by operation of the NAND gate 920.

The NAND gate 930 receives the output of an inverter 936 at one of its input connections. The 2LO signal is supplied over connection 932 to the inverter 936. The output of the inverter 936 on input connection 938 is the $\overline{\text{2LO}}$ signal. The NAND gate 930 receives the LO_Q signal on input connection 934. The $\overline{\text{2LO}}$*LO_Q signal is generated on connection 939 by operation of the NAND gate 930.

The NAND gate 940 receives the output of inverter 946 on input connection 947 and receives the output of inverter 948 on input connection 945. The 2LO signal is supplied over connection 942 to the inverter 946. The output of the inverter 946 on input connection 947 is the $\overline{\text{2LO}}$ signal. The LO_Q signal is supplied over connection 944 to the inverter 948. The output of the inverter 948 on input connection 945 is the $\overline{\text{LO\_Q}}$ signal. The $\overline{\text{2LO}}$*$\overline{\text{LO\_Q}}$ signal is generated on connection 949 by operation of the NAND gate 940.

Figure 10:
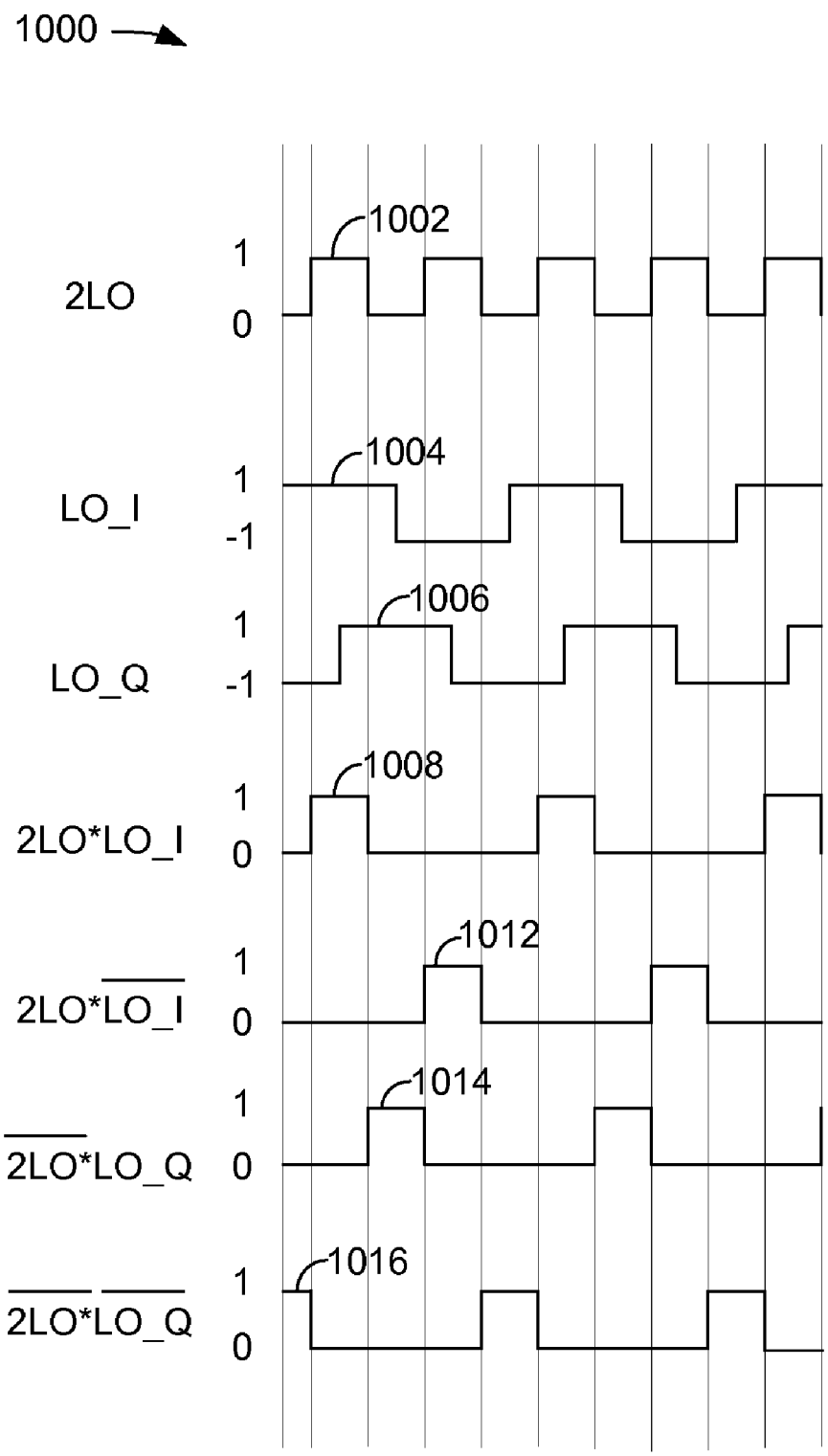
FIG. 10 is a graphical illustration showing the LO signals used in the embodiment of the LO 2LO upconverter described in FIG. 8.

FIG. 10 is a graphical illustration 1000 showing the LO signals used in the embodiment of the LO 2LO upconverter described in FIG. 8. The 2LO signal is shown by signal trace 1002, the LO_I signal is shown by signal trace 1004 and the LO_Q signal is shown by signal trace 1006.

The 2LO*LO_I signal is shown by signal trace 1008, the 2LO*$\overline{\text{LO\_I}}$ signal is shown by signal trace 1012, the $\overline{\text{2LO}}$*LO_Q signal is shown by signal trace 1014 and the 2LO*$\overline{\text{LO\_Q}}$ signal is shown by signal trace 1016.

An advantage of the alternative embodiment shown in FIG. 8, FIG. 9 and FIG. 10 is that it removes any non-ideality due to extra switches, such as the switches described above that operate based on the 2LO signal. This is particularly important for fabrication processes that may form switches that may have less than ideal operating characteristics. The drawback is the increased power consumption due to the use of low-noise logic operations, as shown in FIG. 9.

Figure 11:
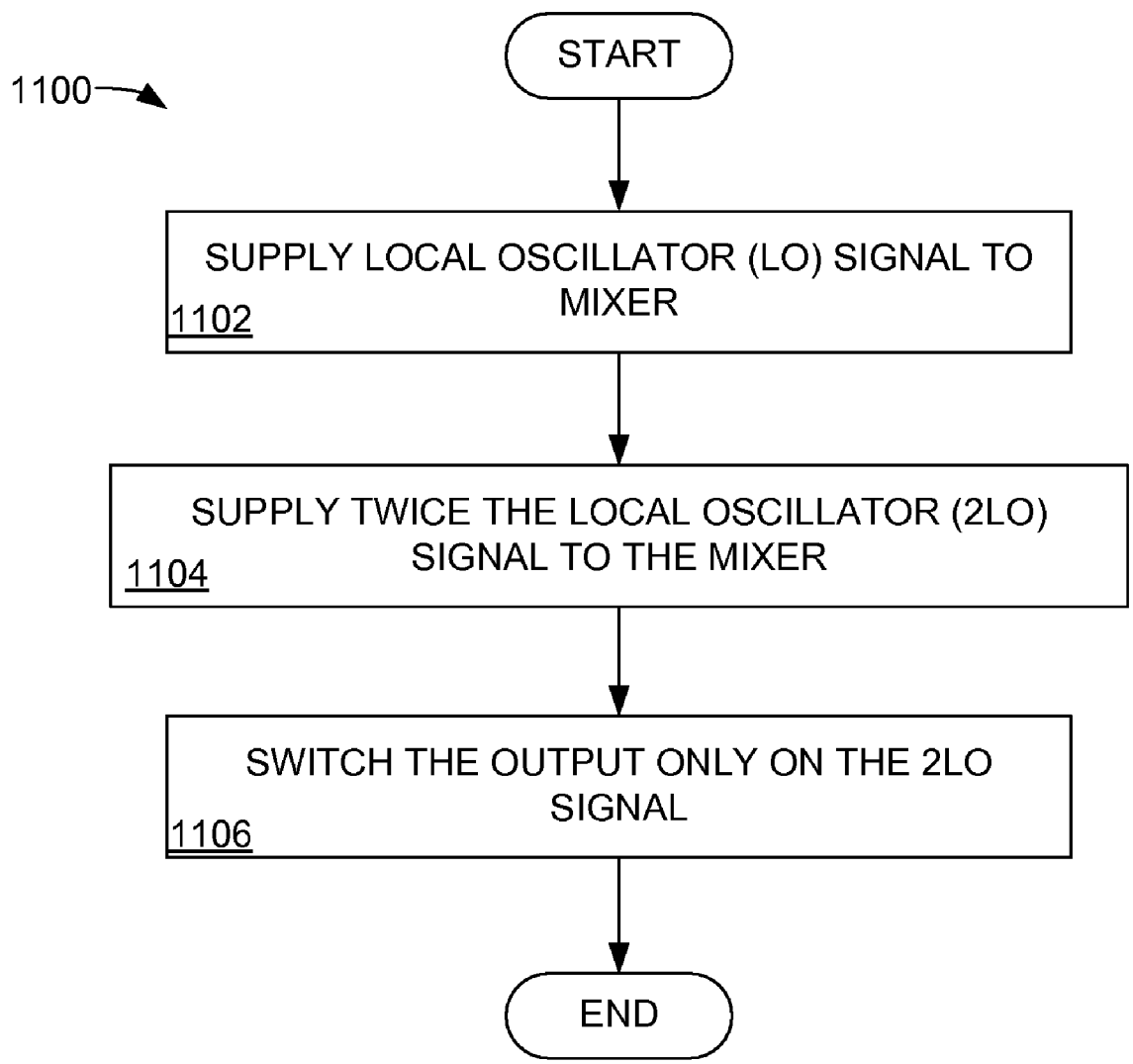
FIG. 11 is a flow chart describing the operation of an embodiment of the LO 2LO upconverter.

FIG. 11 is a flow chart 1100 describing the operation of an embodiment of the LO 2LO upconverter. The blocks in the flowchart can be performed in or out of the order shown by the elements described above.

In block 1102, an LO signal is supplied to a mixer core. In block 1104, a signal at twice the LO signal (2LO) frequency is supplied to the mixer core. In block 1106, the output of the mixer core switches on the 2LO signal.

While various embodiments of the invention have been described, it will be apparent to those of ordinary skill in the art that many more embodiments and implementations are possible that are within the scope of the invention. For example, the invention is not limited to a specific type of radio transmitter or transceiver. Embodiments of the invention are applicable to different types of radio transmitters and transceivers and are applicable to any transmitter that upconverts a transmit signal.

What is claimed is:

1. An upconverter architecture, comprising:
a switching architecture configured to receive an input signal, a first local oscillator (LO) signal, and a second local oscillator (2LO) signal that is at a frequency that is twice a frequency of the first local oscillator (LO) signal, wherein the switching architecture is configured to switch the input signal on transitions of the second local oscillator (2LO) signal, in which the switching architecture results in an effective local oscillator (eLO) signal that switches the input signal during a time period in which the first local oscillator (LO) is stable.

2. The system of claim 1, in which the switching architecture further comprises:
a first set of switches configured to receive the second local oscillator (2LO) signal; and
a second set of switches configured to receive the first local oscillator (LO) signal.

3. The system of claim 2, in which the second set of switches is active when the first set of switches discards the input signal.

4. The system of claim 2, further comprising a transconductance amplifier located to provide the input signal to the first set of switches.

5. The system of claim 2, in which the first set of switches further comprises two switch elements for each quadrature phase of the input signal.

6. An upconverter, comprising:

a switching architecture configured to receive an input signal, a first local oscillator (LO) signal, and a second local oscillator (2LO) signal that is at a frequency that is twice a frequency of the local oscillator (LO) signal, wherein the switching architecture is configured to switch the input signal on transitions of the second local oscillator (2LO) signal, and wherein the first local oscillator signal and the second local oscillator signal are combined to form combined LO 2LO switching signals, in which the switching architecture results in an effective local oscillator (eLO) signal that switches the input signal during a time period in which the first local oscillator (LO) is stable.

7. The upconverter of claim 6, in which the switching architecture further comprises four switch elements for each of two quadrature phases of the input signal.

8. A method for upconverting a signal, comprising:

receiving an input signal;

switching the input signal using a first local oscillator (LO) signal, and a second local oscillator (2LO) signal that is at a frequency that is twice a frequency of the first local oscillator (LO) signal, wherein the switching occurs on transitions of the second local oscillator (2LO) signal, and wherein the first local oscillator signal and the second local oscillator signal are combined to form combined LO 2LO switching signals comprising an effective local oscillator (eLO) signal that switches the input signal during a time period in which the first local oscillator (LO) is stable.

9. The method of claim 8, further comprising switching the input signal using the first local oscillator (LO) signal when the input signal is discarded by the second local oscillator (2LO) signal.

10. A transmitter upconverter architecture having a passive mixer, comprising:

a frequency source configured to develop a local oscillator signal (2LO) that is at a frequency that is twice a desired local oscillator (LO) frequency;

a divider configured to receive the local oscillator signal (2LO) that is at a frequency that is twice a desired local oscillator (LO) frequency;

a passive mixer configured to receive the 2LO signal and the LO signal and configured to switch an input radio frequency signal on transitions of the 2LO signal, and wherein the 2LO signal and the LO signal are combined to form combined LO 2LO switching signals, and wherein noise contributed by the divider is suppressed by the passive mixer.

11. The transmitter upconverter architecture of claim 10, further comprising an in-phase (I) input signal and a quadrature-phase (Q) input signal supplied to the passive mixer, wherein the passive mixer isolates the I input signal from the Q input signal.

12. The transmitter upconverter architecture of claim 10 wherein the combined LO 2LO switching signals comprise an effective local oscillator (eLO) signal that switches the input radio frequency signal during a time period in which the first local oscillator (LO) is stable.

13. The transmitter upconverter architecture of claim 10, in which the passive mixer further comprises:

a first set of switches configured to receive the local oscillator (LO) signal; and a second set of switches configured to receive local oscillator (2LO) signal.

14. The transmitter upconverter architecture of claim 13, in which the second set of switches further comprises two switch elements for each quadrature phase of the input radio frequency signal.

15. The transmitter upconverter architecture of claim 13, in which the first set of switches is active when the second set of switches discards the input signal.

16. The upconverter of claim 6, in which the switching architecture further comprises:

a first set of switches configured to receive the first local oscillator (LO) signal; and a second set of switches configured to receive the second local oscillator (2LO) signal.

17. The upconverter of claim 16, in which the second set of switches further comprises two switch elements for each quadrature phase of the input signal.

18. The upconverter of claim 16, in which the first set of switches is active when the second set of switches discards the input signal.

* * * * *